US009385221B2

(12) United States Patent
Kim et al.

(10) Patent No.: US 9,385,221 B2
(45) Date of Patent: Jul. 5, 2016

(54) NANOWIRE TRANSISTOR WITH UNDERLAYER ETCH STOPS

(71) Applicant: Intel Corporation, Santa Clara, CA (US)

(72) Inventors: Seiyon Kim, Portland, OR (US); Daniel Aubertine, North Plains, OR (US); Kelin Kuhn, Aloha, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/688,647

(22) Filed: Apr. 16, 2015

(65) Prior Publication Data

US 2015/0221744 A1  Aug. 6, 2015

Related U.S. Application Data

(62) Division of application No. 13/996,848, filed as application No. PCT/US2013/031964 on Mar. 15, 2013, now Pat. No. 9,064,944.

(51) Int. Cl.
*H01L 21/336* (2006.01)
*H01L 29/66* (2006.01)
*H01L 29/78* (2006.01)
(Continued)

(52) U.S. Cl.
CPC ........ *H01L 29/6681* (2013.01); *H01L 29/0673* (2013.01); *H01L 29/1037* (2013.01); *H01L 29/42392* (2013.01); *H01L 29/66439* (2013.01); *H01L 29/66795* (2013.01);
(Continued)

(58) Field of Classification Search
None
See application file for complete search history.

(56) References Cited

U.S. PATENT DOCUMENTS

2004/0227181 A1* 11/2004 Yeo ...................... H01L 21/8221
257/328
2006/0049429 A1  3/2006 Kim et al.
(Continued)

FOREIGN PATENT DOCUMENTS

JP       2011-187901 A     9/2011
KR  10-2009-0093081 A     9/2009
(Continued)

OTHER PUBLICATIONS

International Search Report and Written Opinion received for Patent Application No. PCT/US2013/031964, mailed on Nov. 27, 2013, 10 pages.
(Continued)

*Primary Examiner* — Daniel Whalen
(74) *Attorney, Agent, or Firm* — Winkle, PLLC

(57) ABSTRACT

A nanowire device of the present description may be produced with the incorporation of at least one underlayer etch stop formed during the fabrication of at least one nanowire transistor in order to assist in protecting source structures and/or drain structures from damage that may result from fabrication processes. The underlayer etch stop may prevent damage to the source structures and/or drain the structures, when the material used in the fabrication of the source structures and/or the drain structures is susceptible to being etched by the processes used in the removal of the sacrificial materials, i.e. low selectively to the source structure and/or the drain structure materials, such that potential shorting between the transistor gate electrodes and contacts formed for the source structures and/or the drain structures may be prevented.

7 Claims, 17 Drawing Sheets

(51) Int. Cl.
- *H01L 29/775* (2006.01)
- *H01L 29/06* (2006.01)
- *H01L 29/423* (2006.01)
- *H01L 29/786* (2006.01)
- *H01L 29/10* (2006.01)

(52) U.S. Cl.
CPC ....... *H01L 29/66818* (2013.01); *H01L 29/775* (2013.01); *H01L 29/785* (2013.01); *H01L 29/78696* (2013.01)

(56) References Cited

U.S. PATENT DOCUMENTS

| | | |
|---|---|---|
| 2012/0273902 A1 | 11/2012 | Lin et al. |
| 2012/0280205 A1 | 11/2012 | Bangsaruntip et al. |
| 2014/0225065 A1* | 8/2014 | Rachmady ........ H01L 29/42392 257/24 |
| 2014/0227847 A1* | 8/2014 | Yoon ................ H01L 29/66545 438/283 |

FOREIGN PATENT DOCUMENTS

| KR | 10-2013-0000206 A | 1/2013 |
|---|---|---|
| WO | 2014/142952 A1 | 9/2014 |

OTHER PUBLICATIONS

International Preliminary Report on Patentability and Written Opinion Received for PCT Patent Application No. PCT/US2013/031964, mailed on Sep. 24, 2015, 7 pages.

\* cited by examiner

NANOWIRE TRANSISTOR WITH UNDERLAYER ETCH STOPS

RELATED APPLICATIONS

The present application is a divisional of U.S. patent application Ser. No. 13/996,848, filed on Jun. 21, 2013, entitled "NANOWIRE TRANSISTOR WITH UNDERLAYER ETCH STOPS", which claims priority under 35 U.S.C. 371 from International Application No. PCT/US2013/031964, filed on Mar. 15, 2013, entitled "NANOWIRE TRANSISTOR WITH UNDERLAYER ETCH STOPS", which are hereby incorporated herein by reference in their entirety and for all purposes.

TECHNICAL FIELD

Embodiments of the present description generally relate to the field of nanowire microelectronic devices, and, more particularly, to a nanowire structure formed using at least one underlayer etch stop to prevent removal of portions of a source structure or a drain structure during the removal of sacrificial layers during the fabrication of nanowire channels.

BACKGROUND

Higher performance, lower cost, increased miniaturization of integrated circuit components, and greater packaging density of integrated circuits are ongoing goals of the microelectronic industry for the fabrication of microelectronic devices. As these goals are achieved, the microelectronic devices scaled down, i.e. become smaller, which increases the need for optimal performance from each integrated circuit component.

Maintaining mobility improvement and short channel control as microelectronic device dimensions scale down past the 15 nanometer (nm) node provides a challenge in microelectronic device fabrication. Nanowires may be used to fabricate microelectronic devices which provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example).

Many different techniques have been attempted to fabricate and size nanowire-based device. However, improvements may still be need in the area of fabricating reliable nanowire transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
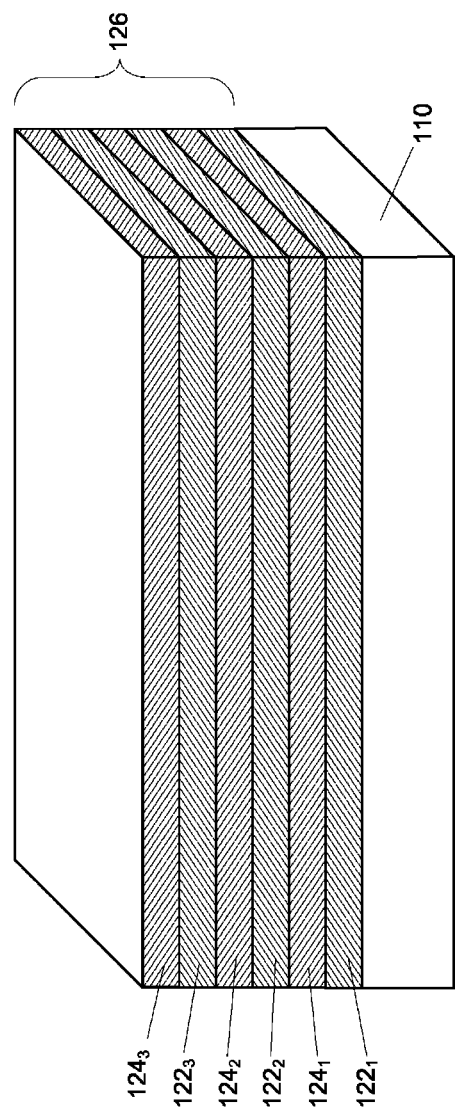
FIGS. 1-11 and 13-15 are oblique and side cross-sectional views of a process of forming a nanowire transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the production of nanowire transistors, a plurality of stacked channel nanowires may be formed, which requires removing sacrificial materials from between channel gate material layers, known as a "nanowire release process". The nanowire release process may include etch-out processes, such as a dry etch, a wet etch, a combination of oxidation and wet etch, and the like. However, these processes may create a risk of damage to source structures and/or drain structures of the nanowire transistors, when the material used in the fabrication of the source structures and/or the drain structures is susceptible to being etched by the processes used in the removal of the sacrificial materials, i.e. low selectively to the source structure and/or the drain structure materials. Thus, the nanowire release process may result in damage to the source structures and/or the drain structures, which may lead to shorting between a transistor gate electrode and contacts formed for the source structures and/or the drain structures, as will be understood to those skilled in the art.

Embodiments of the present description include the incorporation of at least one underlayer etchstop formed during the fabrication of at least one nanowire transistor in order to assist in protecting the source structures and/or drain structures from damage that may result from fabrication processes, such as those used in the nanowire release process.

FIGS. 1-11 and 13-15 illustrate methods of forming a nanowire transistor. For the sake of conciseness and clarity, the formation of a single nanowire transistor will be illustrated. As illustrated in FIG. 1, the microelectronic substrate 110 may provided or formed from any suitable material. In one embodiment, the microelectronic substrate 110 may be a bulk substrate composed of a single crystal of a material which may include, but is not limited to, silicon, germanium, silicon-germanium or a III-V compound semiconductor material. In other embodiments, the microelectronic substrate 110 may comprise a silicon-on-insulator substrate (SOI), wherein an upper insulator layer composed of a material which may include, but is not limited to, silicon dioxide, silicon nitride or silicon oxy-nitride, disposed on the bulk substrate. Alternatively, the microelectronic substrate 110 may be formed directly from a bulk substrate and local oxidation is used to form electrically insulative portions in place of the above described upper insulator layer.

As further shown in FIG. 1, a plurality of sacrificial material layers (illustrated as elements $122_1$, $122_2$, and $122_3$) alternating with a plurality of channel material layers (illustrated as elements $124_1$, $124_2$, and $124_3$) may be formed by any known technique, such as by epitaxial growth, on the microelectronic substrate 110 to form a layered stack 126. In one embodiment, the sacrificial material layers $122_1$, $122_2$, and $122_3$ may be silicon layers and the channel material layers $124_1$, $124_2$, and $124_3$ may be silicon germanium layers. In another embodiment, the sacrificial material layers $122_1$, $122_2$, and $122_3$ may be silicon germanium layers and the channel material layers $124_1$, $124_2$, and $124_3$ may be silicon layer. Although three sacrificial material layers and three channel material layers are shown, it is understood that any appropriate number of sacrificial material layers and channel material layers may be used.

Figure 2:
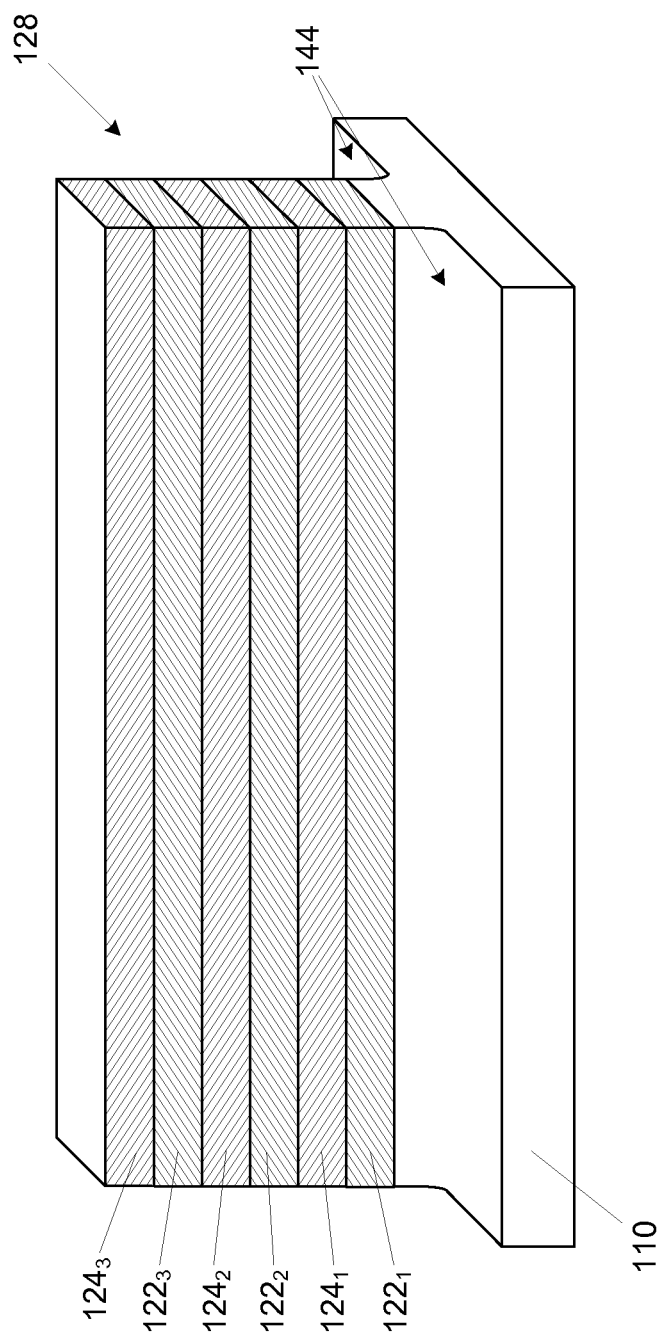
Figure 3:
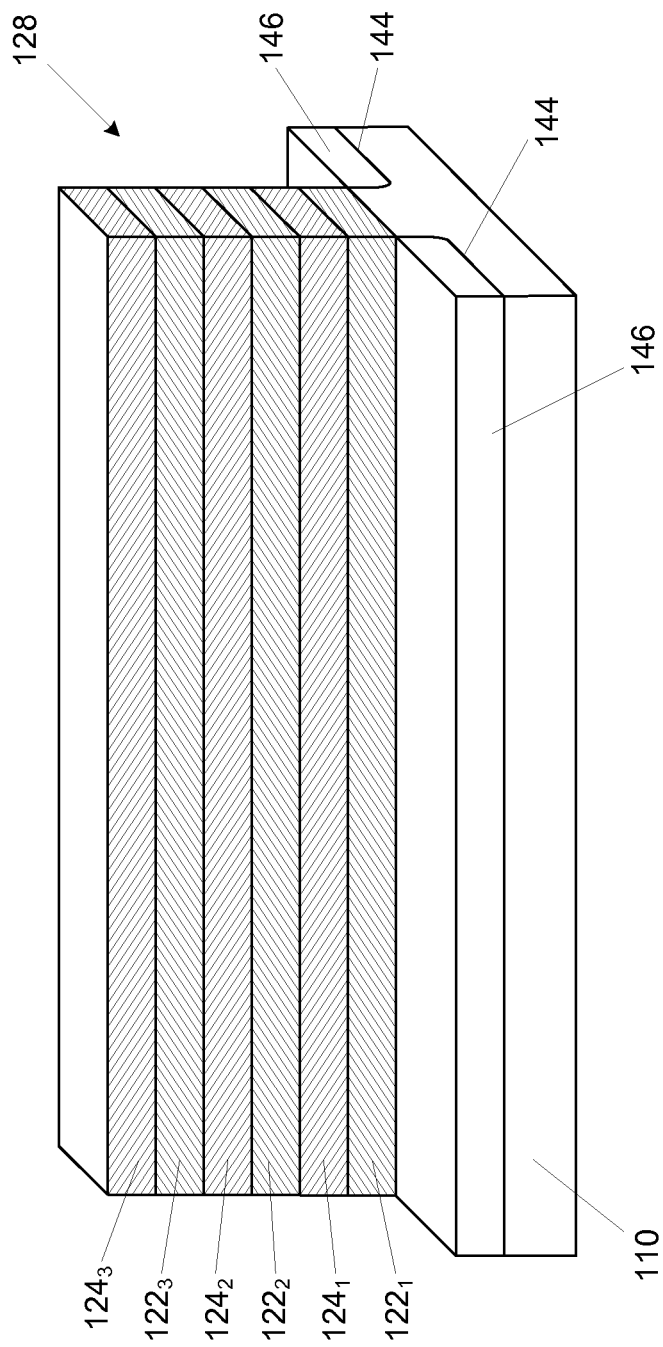

The layered stack 126 of FIG. 2 may be patterned using conventional patterning/etching techniques to form at least one fin structure 128, as shown in FIG. 3. For example, the layered stack 126 of FIG. 2 may be etched during a trench etch process, such as during a shallow trench isolation (STI) process, wherein trenches 144 may be formed in the microelectronic substrate 110 in the formation of the fin structure 128, and wherein the trenches 144 may be formed on opposing sides of the fin structures 128. As will be understood by those skilled in the art, a plurality of substantially parallel of fin structures 128 are generally formed simultaneously.

As shown in FIG. 3, dielectric material structures 146, such as silicon dioxide, may be formed or deposited within the trenches 144 proximate the microelectronic substrate 110 to electrically separate the fin structures 128. As will be understood to those skilled in the art, the process of forming the dielectric material structures 146 may involve a variety of process including, but not limited to, depositing dielectric material, polishing/planarizing the dielectric material, and etching back the dielectric material to form the dielectric material structures 146.

Figure 4:
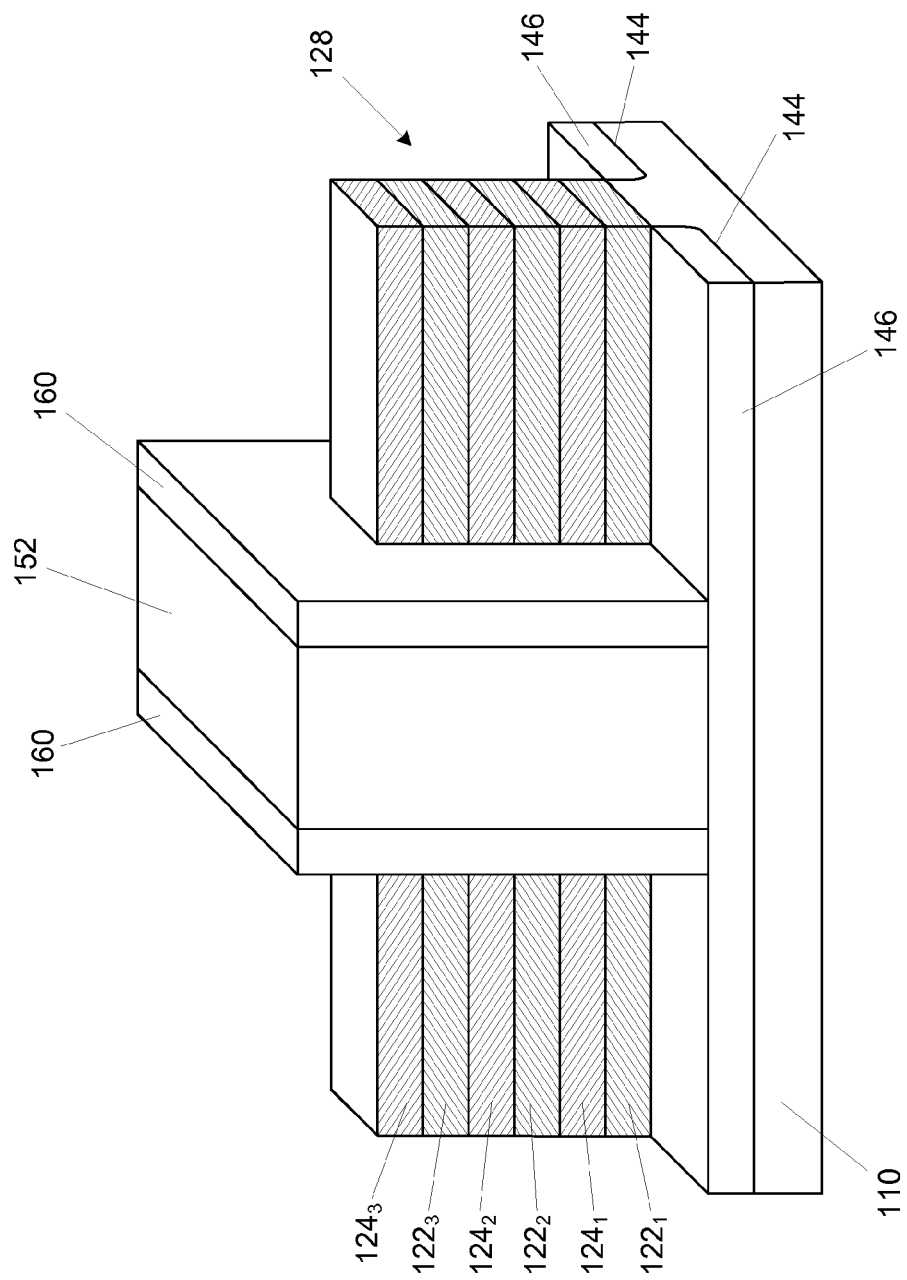
Figure 5:
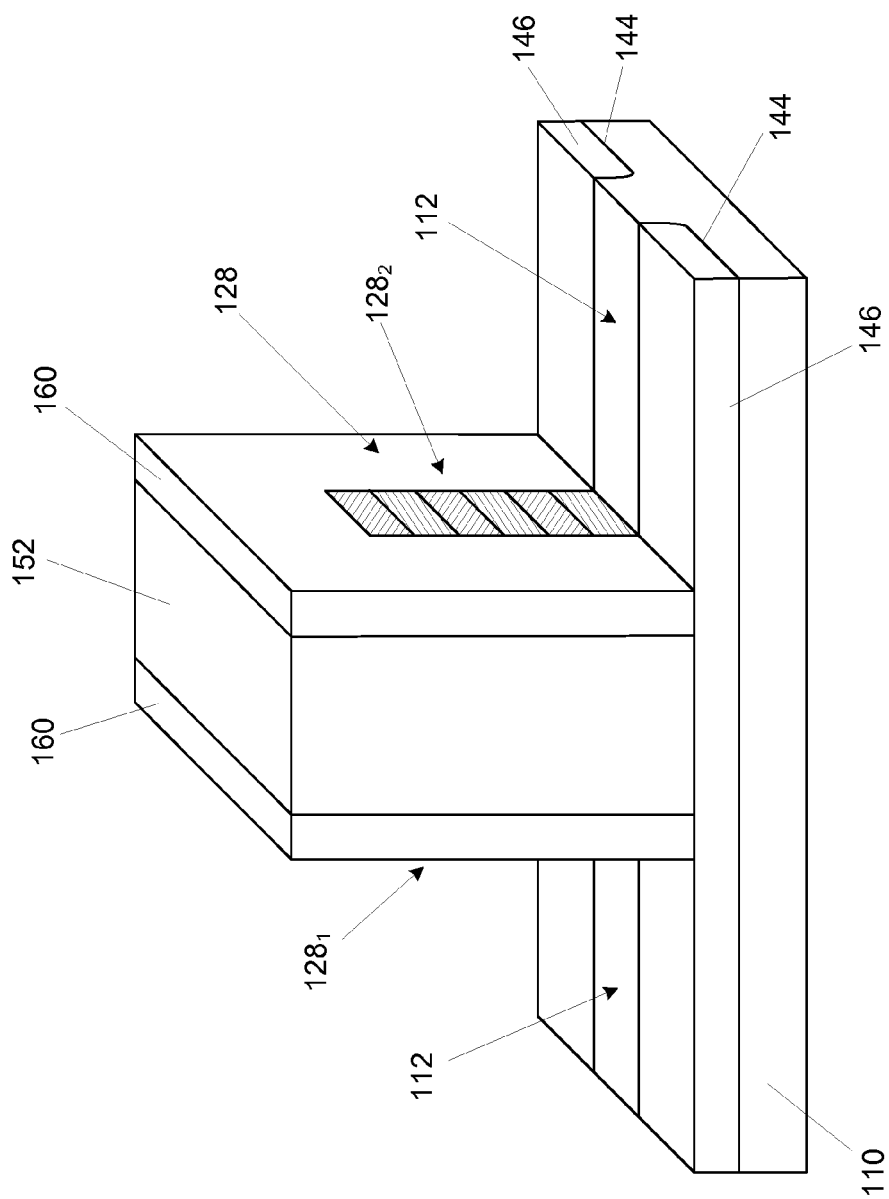
Figure 6:
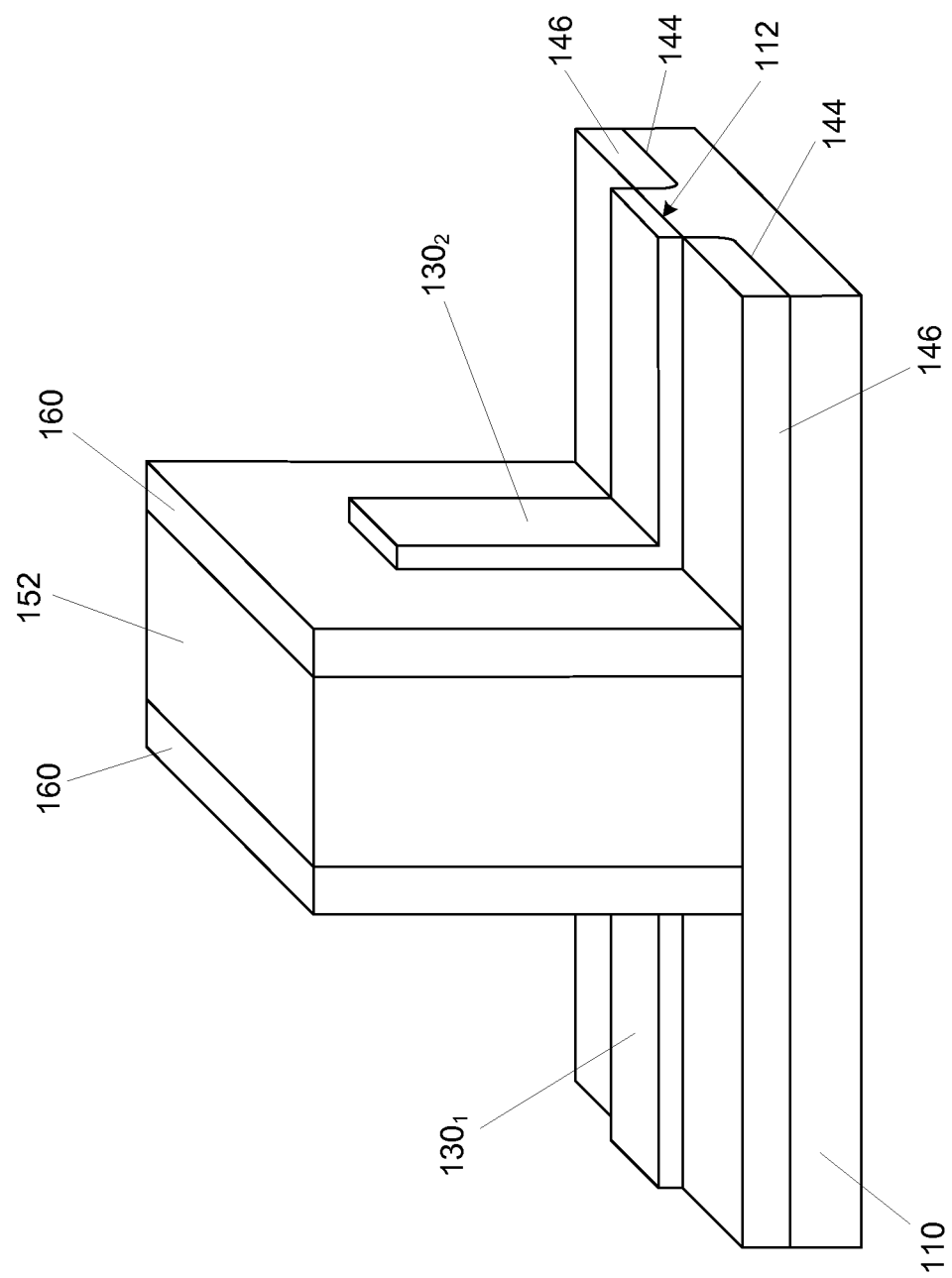

As shown in FIG. 4, spacers 160 may be formed on and across the fin structure 128 and may be disposed substantially orthogonally with respect to the fin structure 128. In an embodiment, the spacers 160 may comprise any material that may be selective during subsequent processing to the fin structure 128 materials, as will be discussed. As further shown in FIG. 4, a sacrificial gate electrode material 152 may be formed within/between the spacers 160, and may be formed around portions of the fin structures 128 located between the spacers 160. In an embodiment, the sacrificial gate electrode material 152 may be formed around portions of the fin structure 128, and the spacers 160 may be on either side of the sacrificial gate electrode material 152. The sacrificial gate electrode material 152 may comprise any appropriate sacrificial material, including, but not limited to polysilicon. As shown in FIG. 5, a portion of each fin structure 128 (external to the sacrificial gate electrode material 152 and the spacers 160) may be removed to expose portions 112 of the microelectronic substrate 110 and form a fin structure first end $128_1$ and a fin structure second end $128_2$ (the fin structure first end $128_1$ is not specifically illustrated, but is essentially the mirror-image of the fin structure second end $128_2$). The portions of each fin structure 128 may be removed by any process known in the art, including, but not limited to, a dry etching process.

Underlayer etch stop structure (shown as first underlayer etch stop structure $130_1$ and second underlayer etch stop structure $130_2$) may be formed to abut the fin structure 128 on opposing ends of the fin structure 128. The first underlayer etch stop structure $130_1$ and the second underlayer etch stop structure $130_2$ may be any appropriate material that is selective to the sacrificial material layers $122_n$, such that the sacrificial material layers $122_n$ may be removed without removing the first underlayer etch stop structure $130_1$ or the second underlay etch stop structure $130_2$, as will be discussed. In one embodiment, the first underlayer etch stop structure $130_1$ and the second underlayer etch stop structure $130_2$ may be a material that may provide a structure for the growth of an epitaxial material. In another embodiment of the present description, the first underlayer etch stop structure $130_1$ and the second underlayer etch stop structure $130_2$ may be the same material as the channel material layer $124_n$. Thus, in a specific embodiment, the first underlayer etch stop structure $130_1$ and the second underlayer etch stop structure $130_2$ may be formed by the epitaxial growth of silicon or silicon germanium to match the channel material layer $124_n$. The epitaxial growth of the first underlayer etch stop structure $130_1$ and the second underlayer etch stop structure $130_2$ may result in the first underlayer etch stop structure $130_1$ and the second underlayer etch stop structure $130_2$ also forming on the exposed portion 112 of the microelectronic substrate 110, as shown.

Figure 7:
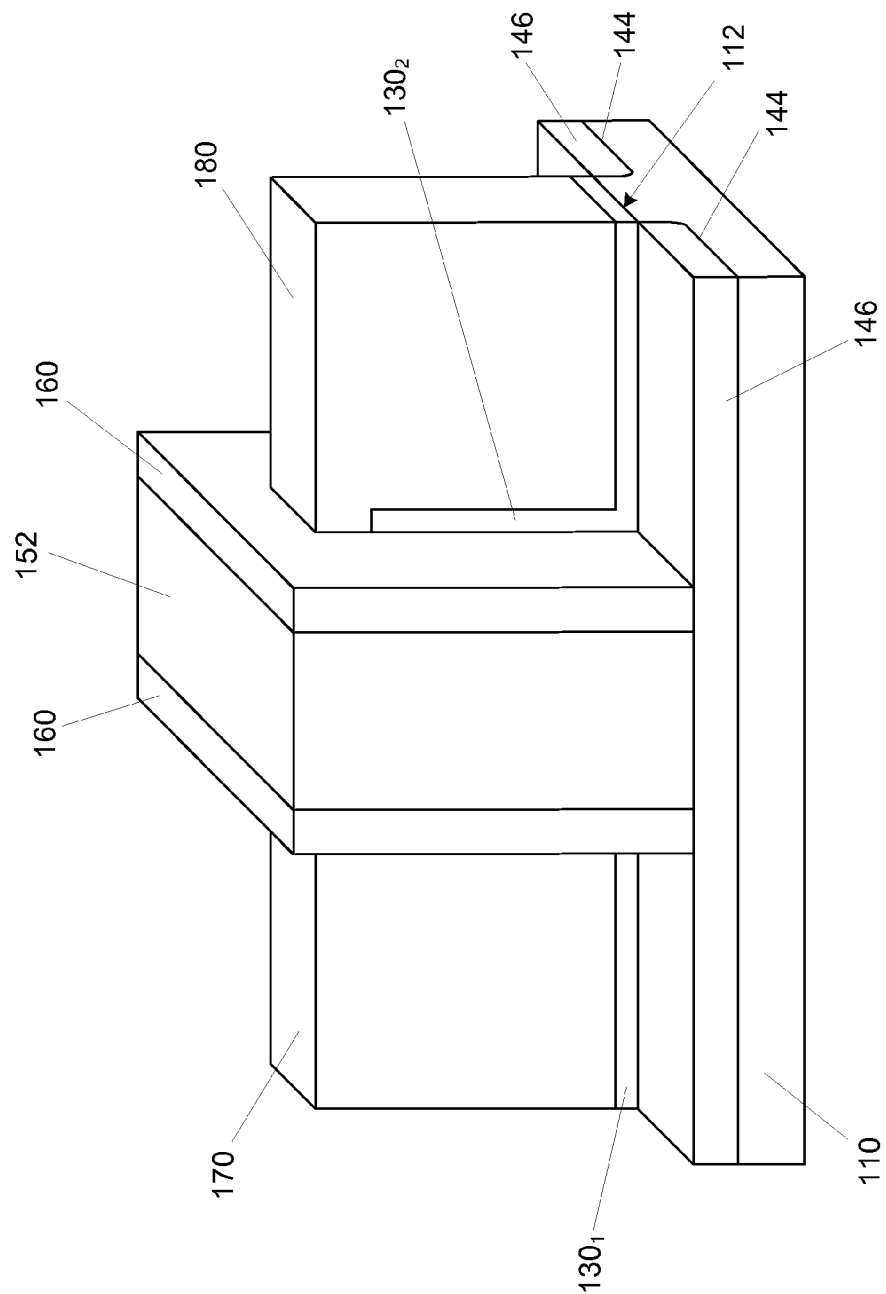

As shown in FIG. 7, a source structure 170 may be formed adjacent the first underlayer etch stop structure $130_1$, and a drain structure 180 may be formed adjacent the second underlayer etch stop $130_2$ on opposing ends of the fin structure 128, such as by an epitaxial growth of silicon or silicon germanium. In an embodiment, the source structure 170 or the drain structures 180 may be n-doped silicon for an NMOS device, or may be p-doped silicon/silicon germanium for a PMOS device, depending on the device type for the particular application. Doping may be introduced in the epitaxial process, by implant, by plasma doping, by solid source doping or by other methods as are known in the art.

Figure 8:
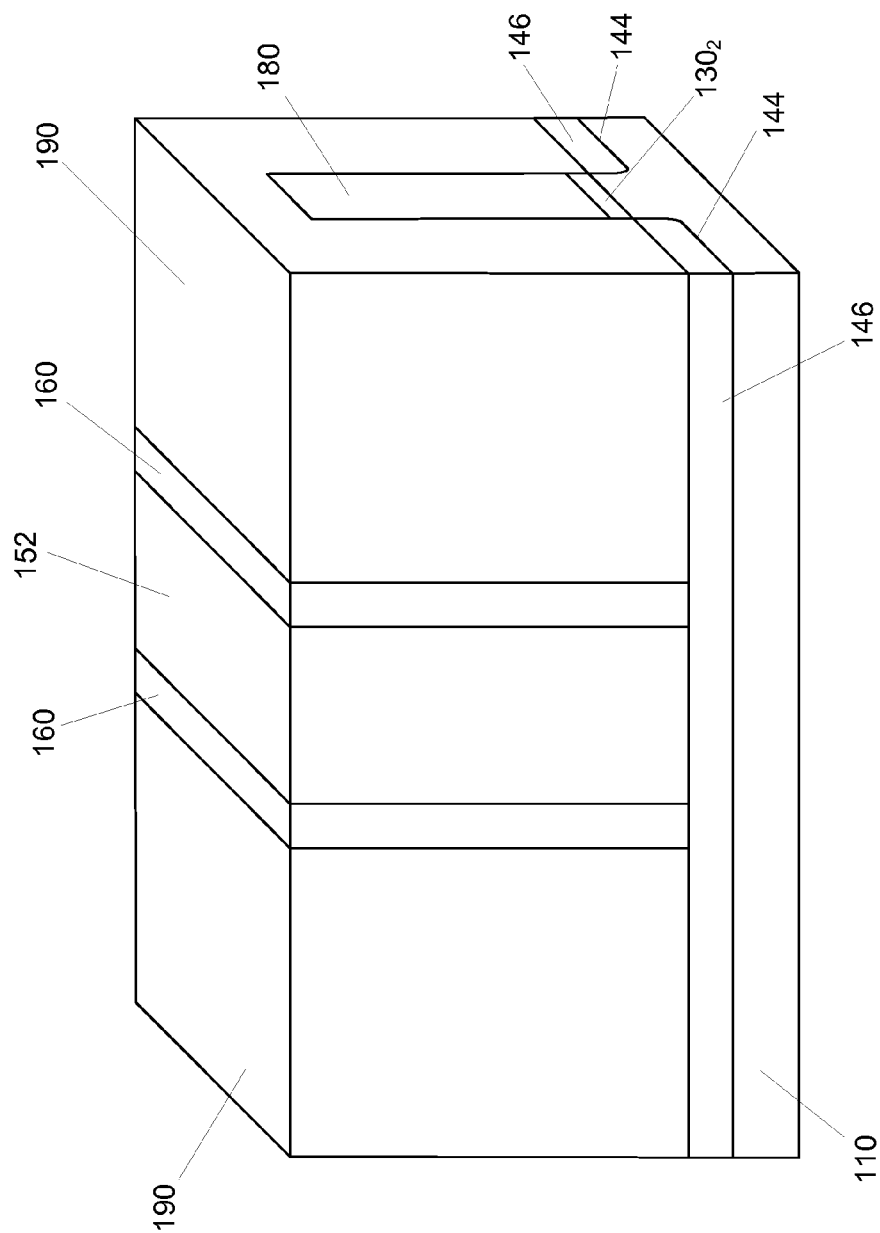
Figure 9:
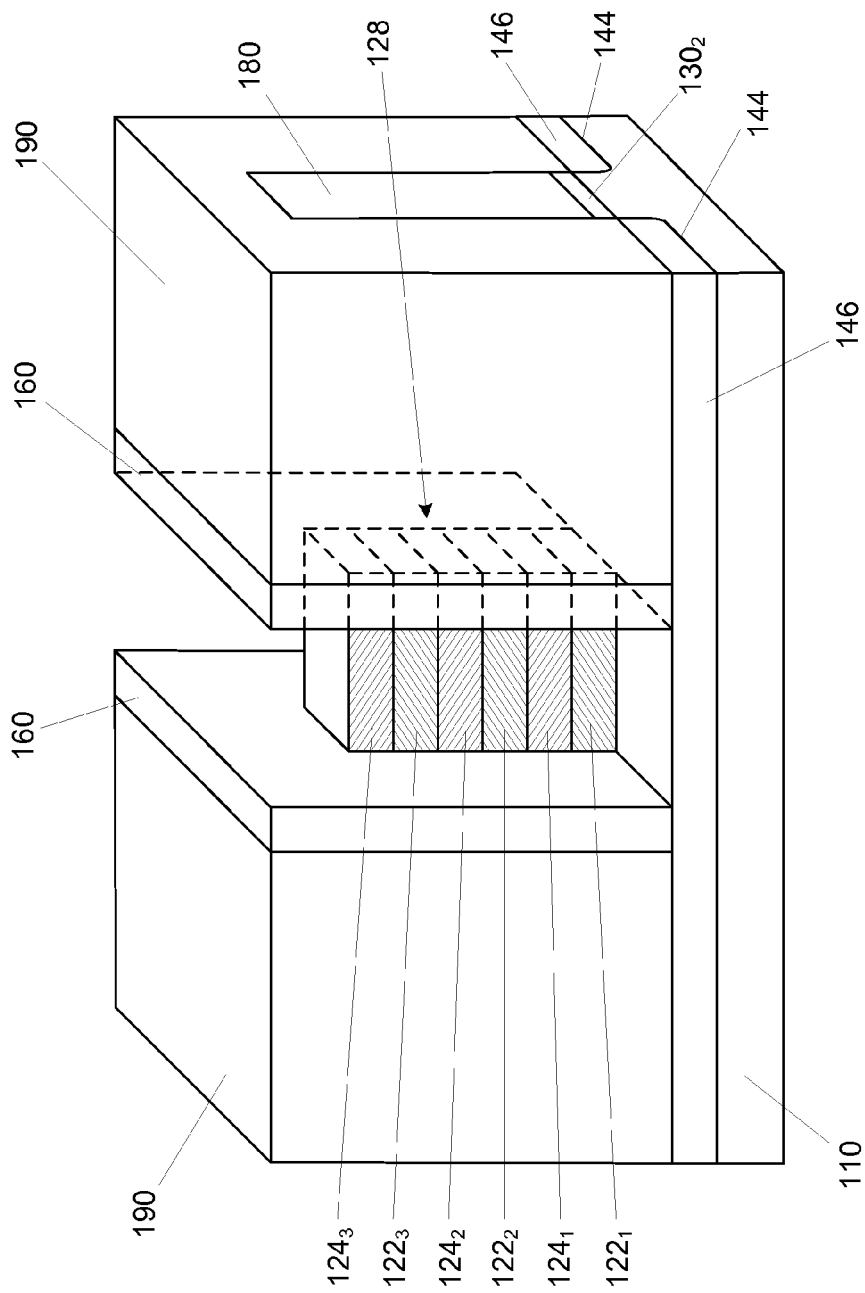

As shown in FIG. 8, an interlayer dielectric layer 190 may be formed on the microelectronic substrate 110 over the source structures 170, the drain structures 180, the sacrificial gate electrode material 152, and the spacers 160, wherein the interlayer dielectric layer 190 may be planarized, such as by chemical mechanical polishing, to expose the sacrificial gate electrode material 152. As shown in FIG. 9, the sacrificial gate electrode material 152 may then be removed from between the spacer materials 160, such as by an etching process.

Figure 10:
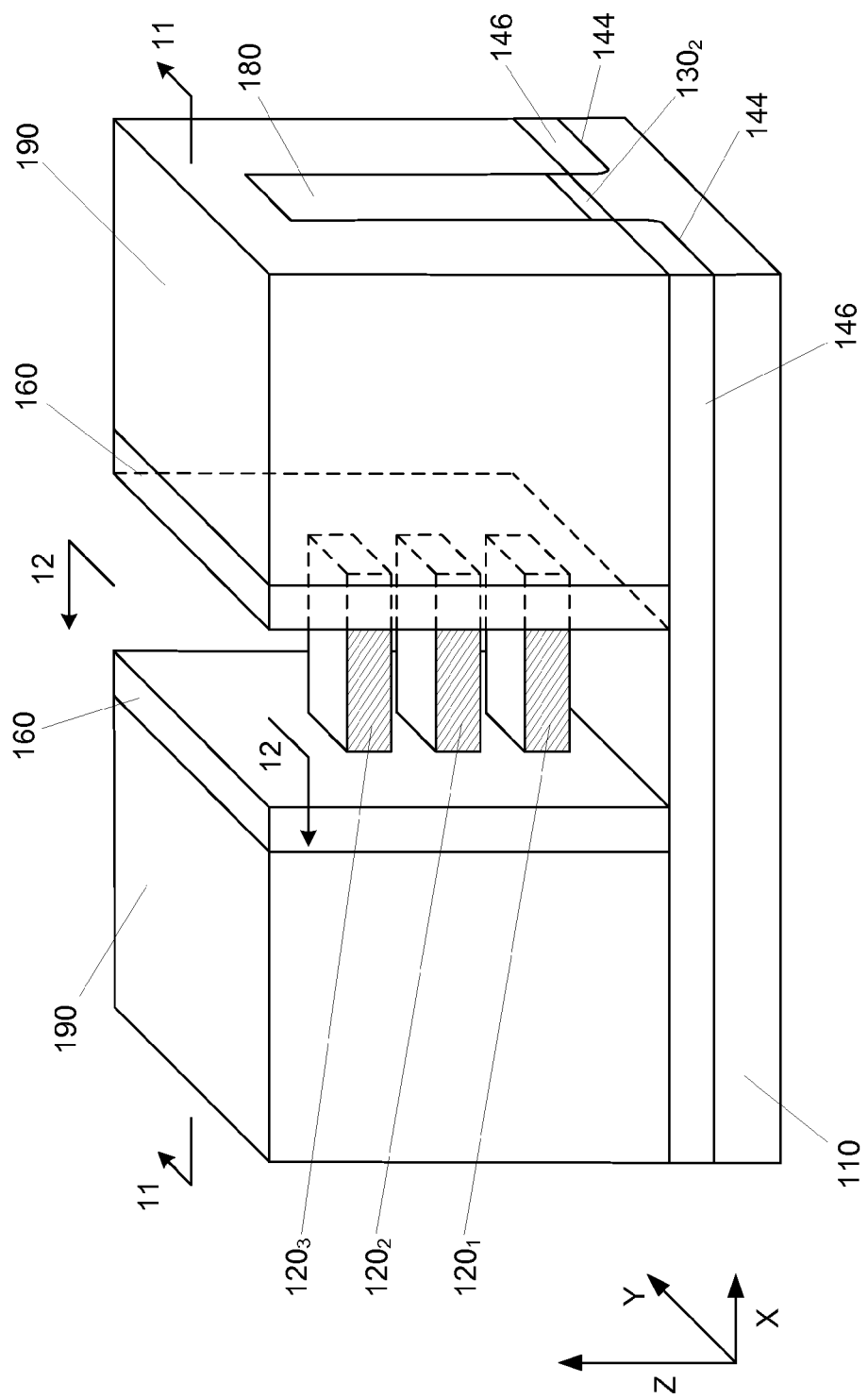
Figure 11:
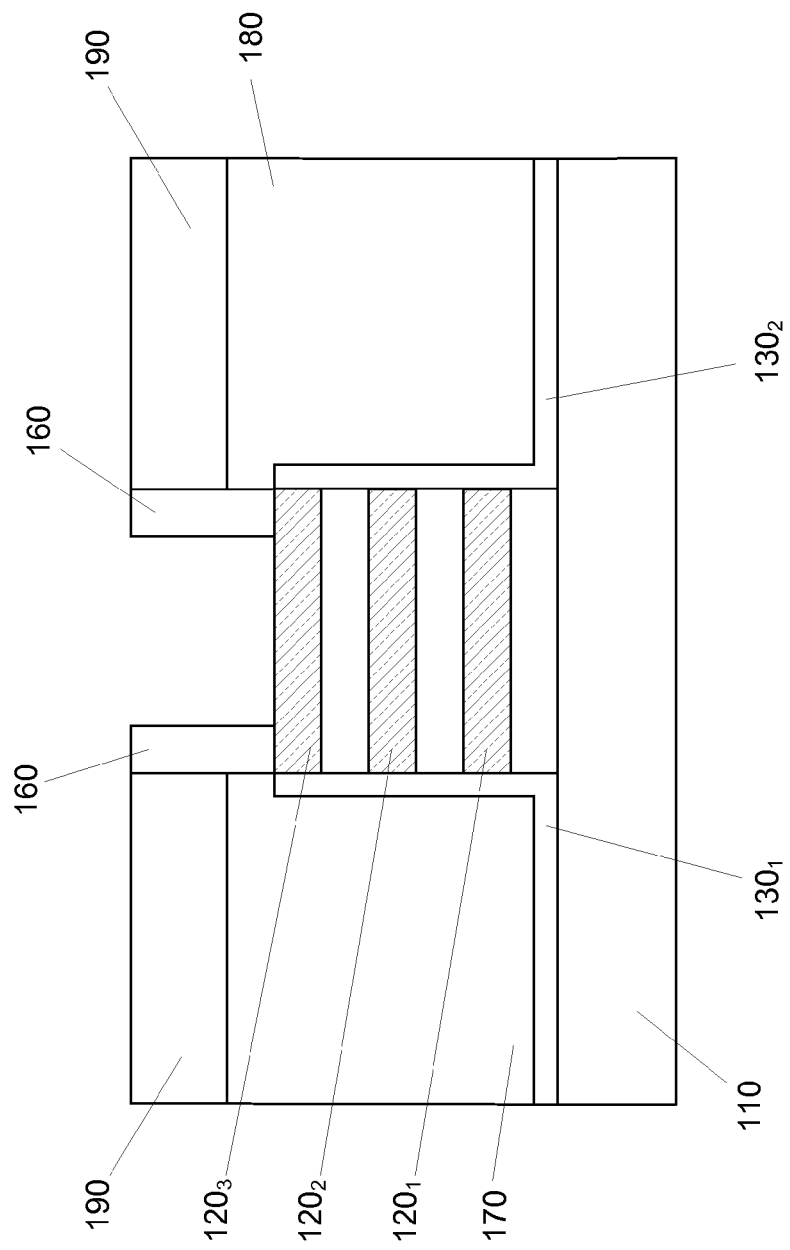

As shown in FIGS. 10 and 11 (cross-section along line 11-11 of FIG. 10), the sacrificial material layers $122_1$, $122_2$, and $122_3$ (see FIG. 9) may be selectively removed from the fin structure 128 (see FIG. 9) between the channel material layers $124_1$, $124_2$, and $124_3$ (see FIG. 9) to form channel nanowires (illustrated as elements $120_1$, $120_2$, and $120_3$, and may be referred to herein collectively as "channel nanowires $120_n$") extending between the source structure 170 (see FIG. 7) and the drain structure 180 with the first underlayer etch stop structure $130_1$ between the channel nanowires $102_n$ and the source structure 170, and the second underlayer etch stop structure $130_2$ between the channel nanowires $102_n$ and the drain structure 180. As shown, the channel nanowires $120_n$ may be aligned vertically (e.g. z-direction) and spaced apart from one another. In an embodiment, the sacrificial material layers $122_1$, $122_2$, and $122_3$ may be etched with a wet etch that selectively removes the sacrificial material layers $122_1$, $122_2$, and $122_3$ while not etching the channel material layers $124_1$, $124_2$, and $124_3$ or the first underlayer etch stop structure $130_1$ or the second underlayer etch stop structure $130_2$. In one embodiment, wherein the sacrificial material layers $122_1$, $122_2$, and $122_3$ are silicon and the channel material layers $124_1$, $124_2$, and $124_3$, as well as the first underlayer etch stop structure $130_1$ and the second underlayer etch stop $130_2$, are silicon germanium, the wet etch may include, but is not limited to, aqueous hydroxide chemistries, including ammonium hydroxide and potassium hydroxide. In another embodiment, the silicon germanium may be removed, rather than the silicon, wherein the first underlayer etch stop structure $130_1$ and the second underlayer etch stop structure $130_2$ would be silicon. The silicon germanium material layers $124_n$ may be selectively removed from the fin structure between the silicon material layers $122_n$. In an embodiment, the silicon germanium may be etched selectively with a wet etch that selectively removes the silicon germanium while not etching the silicon with a wet etch including, but is not limited to, solution of carboxylic acid/nitric acid/hydrofluoric acid, and solutions of citric acid/nitric acid/hydrofluoric acid. In some embodiments of the invention, the same silicon/silicon germanium stack is used to form both transistors with silicon channel nanowires and transistors with silicon germanium channel nanowires. In another embodiment of the invention, the layering order of the silicon/silicon germanium stack may alternate depending on whether silicon channel nanowires or silicon germanium channel nanowires are being formed.

In an embodiment, both silicon and silicon germanium channel nanowires $120_n$ may exist on the same wafer, in the same die, or on the same circuit, for example as NMOS Si and PMOS SiGe in an inverter structure. In an embodiment with NMOS Si and PMOS SiGe in the same circuit, the Si channel thickness (SiGe interlayer) and SiGe channel thickness (Si interlayer) may be mutually chosen to enhance circuit performance and/or circuit minimum operating voltage In an embodiment, the number of wires on different devices in the same circuit may be changed through an etch process to enhance circuit performance and/or circuit minimum operating voltage.

Figure 12:
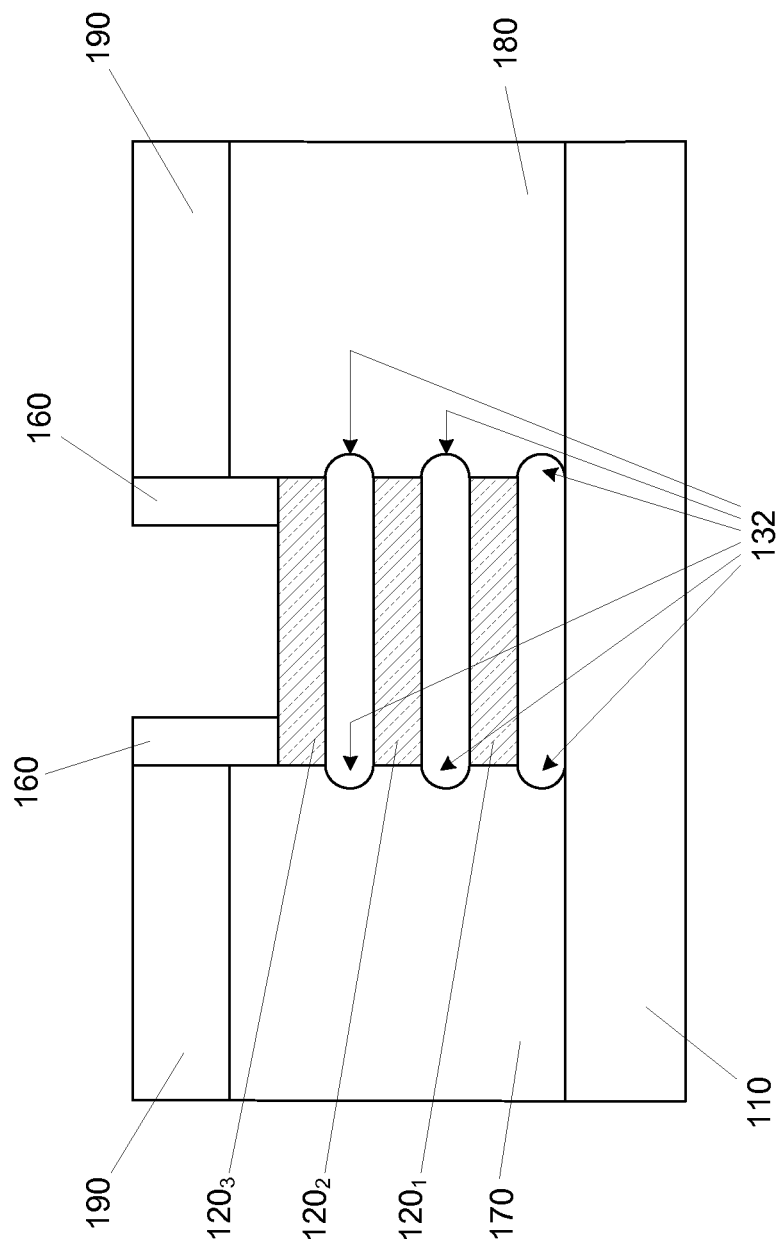
FIG. 12 is a side cross-sectional view illustrating etching damage that may occur without an underlayer etch stop.

As shown in FIG. 12, without an underlayer etch stop, the removal of the sacrificial material layers $122_1$, $122_2$, and $122_3$ may result in the source structures 170 and/or the drain structure 180 being etched or otherwise damaged (shown as etch divots 132).

Figure 13:
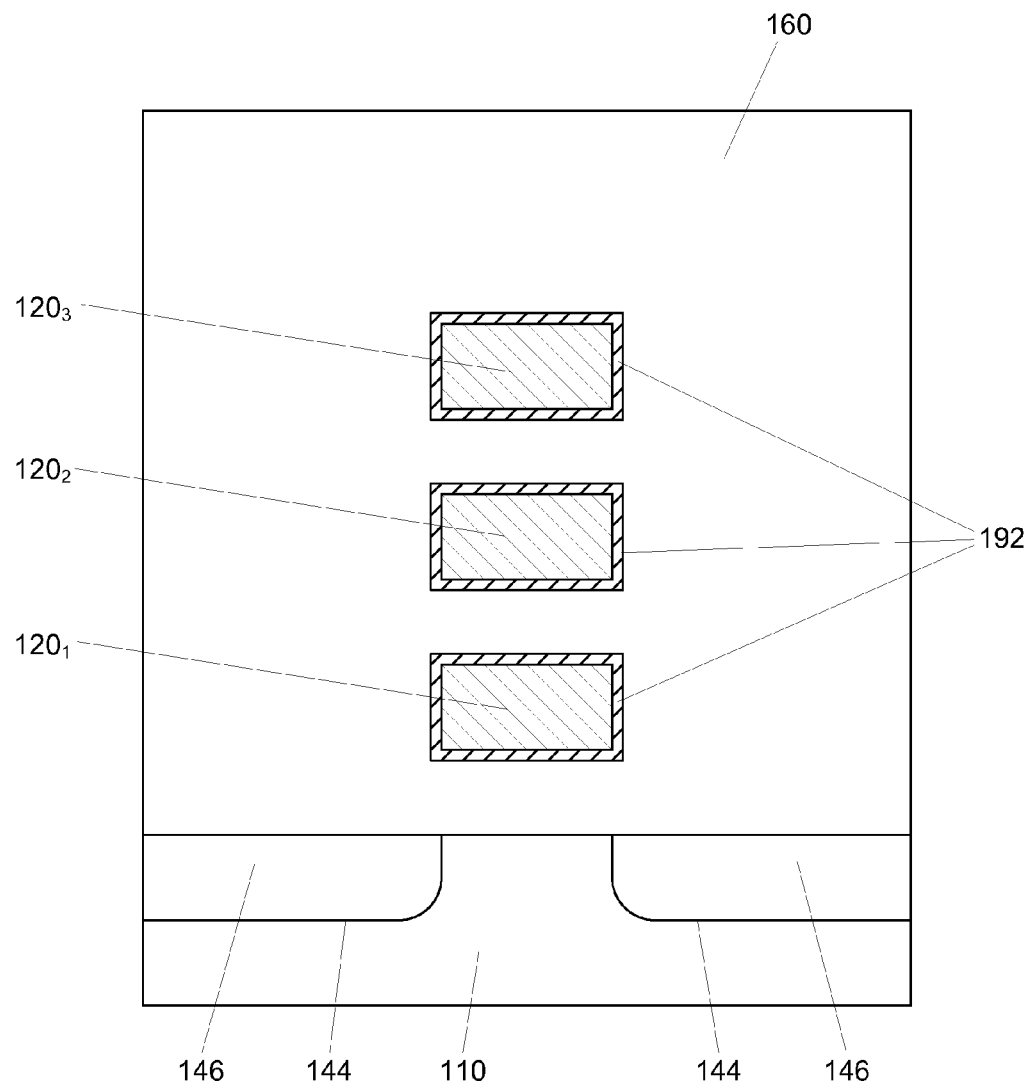

As shown in FIG. 13 (cross-section along line 13-13 of FIG. 10), a gate dielectric material 192 may be formed to surround the channel nanowires $120_1$, $120_2$, and $120_3$ between the spacers 160. In an embodiment, the gate dielectric material 192 may comprise a high k gate dielectric material, wherein the dielectric constant may comprise a value greater than about 4. Example of high k gate dielectric materials may include but are not limited to hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate. In one embodiment, the gate dielectric material 192 may be formed substantially conformally around the channel nanowires $120_1$, $120_2$, and $120_3$, and may form a substantially conformal layer on the spacers 160. The gate dielectric material 192 may be deposited using any method well-known in the art to yield a conformal layer, such as, but not limited to, atomic layer deposition (ALD) and various implementations of chemical vapor deposition (CVD), such as atmospheric pressure CVD (APCVD), low pressure CVD (LPCVD), and plasma enhanced CVD (PECVD).

Figure 14:
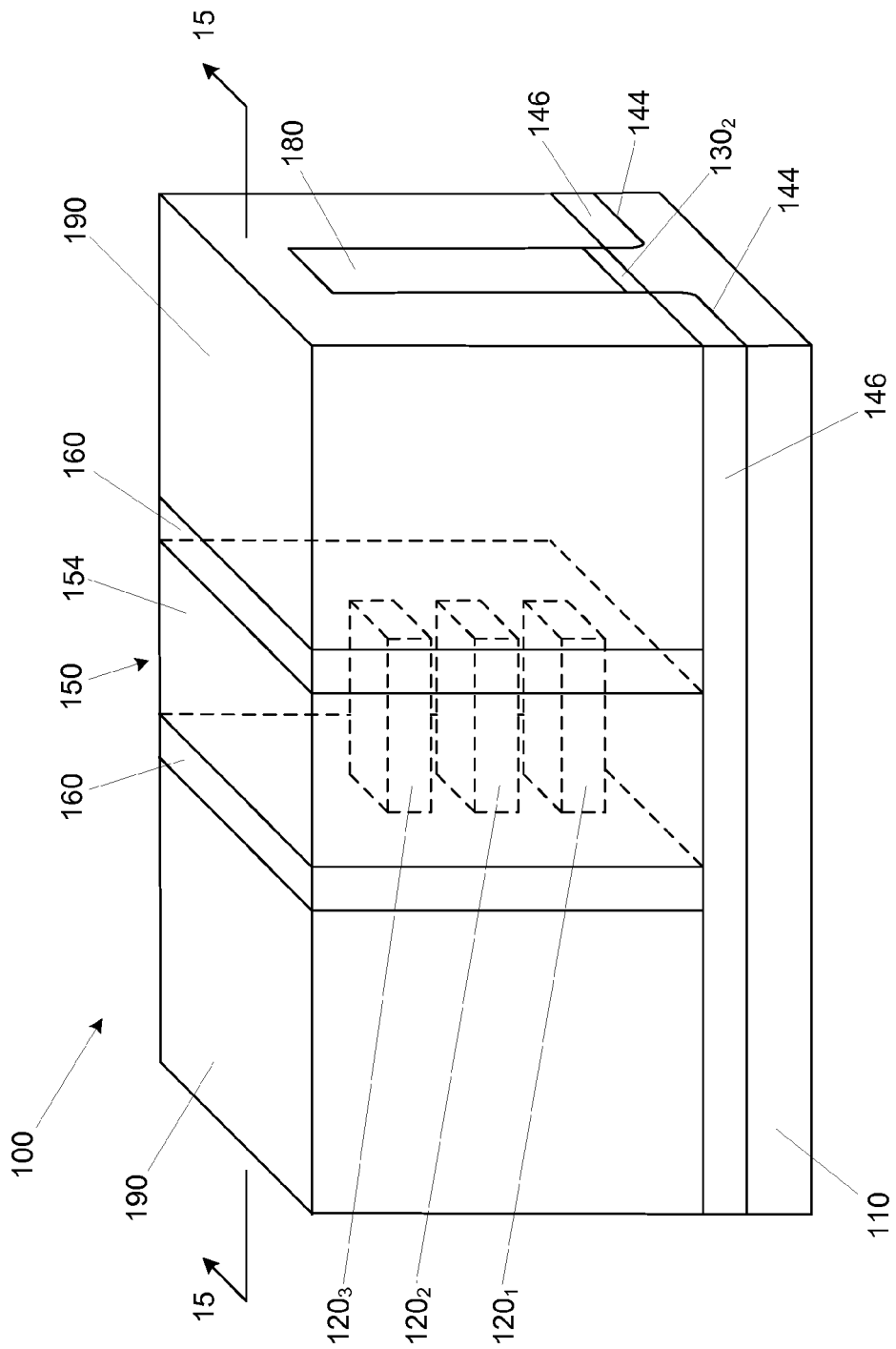
Figure 15:
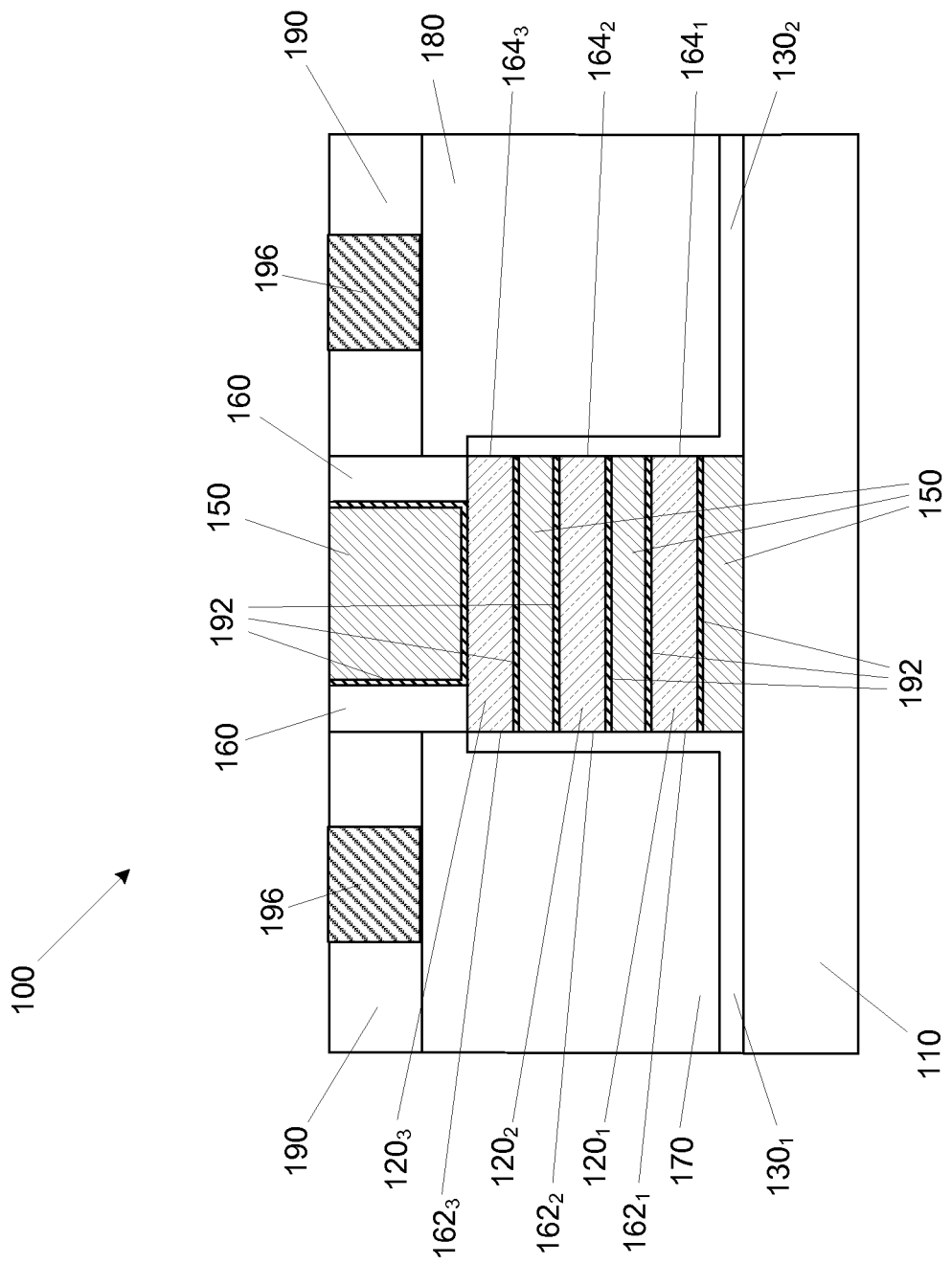

As shown in FIGS. 14 and 15 (cross-section along line 15-15 of FIG. 14), a gate electrode material 154 may then be formed around the channel nanowires $120_1$, $120_2$, and $120_3$ to form a gate electrode 150 and thereby forming a multi-stacked nanowire transistor 100. The gate electrode material 154 may comprise any appropriate conductive material, including, but not limited to, pure metal and alloys of titanium, tungsten, tantalum, aluminum, copper, ruthenium, cobalt, chromium, iron, palladium, molybdenum, manganese, vanadium, gold, silver, and niobium. Less conductive metal carbides, such as titanium carbide, zirconium carbide, tantalum carbide, tungsten carbide, and tungsten carbide, may also be used. The gate electrode material may also be made from a metal nitride, such as titanium nitride and tantalum nitride, or a conductive metal oxide, such as ruthenium oxide. The gate electrode material may also include alloys with rare earths, such as terbium and dysprosium, or noble metals such as platinum.

As shown in FIG. 14, the nanowire transistor 100 may include the at least one at least one nanowire channel $120_1$, $120_2$, and $120_3$ having a first end $162_1$, $162_2$ and $162_3$, respectively, and an opposing second end $164_1$, $164_2$ and $164_3$, respectively, and the source structure 170 proximate the at least one nanowire channel first end $162_1$, $162_2$ and $162_3$, wherein the first underlayer etch stop structure $130_1$ is disposed between the source structure $130_1$ and the at least one nanowire first end $162_1$, $162_2$ and $162_3$, and the drain structure proximate 180 the at least one nanowire second end $164_1$, $164_2$ and $164_3$, wherein the second underlayer etch stop structure $130_2$ is disposed between the drain structure 180 and the at least one nanowire second end $164_1$, $164_2$ and $164_3$. Furthermore, the gate dielectric material 192 may abut the at least one nanowire channel $120_1$, $120_2$, and $120_3$ between the nanowire channel first end $162_1$, $162_2$ and $162_3$ and the nanowire channel second end $164_1$, $164_2$ and $164_3$, respectively. Moreover, the gate electrode 150 may abut the gate dielectric material 192. Still further, the gate electrode 150 may abut the first underlayer etch stop structure $130_1$ and the second underlayer etch stop structure $130_2$.

It is understood that further processing may be conducted, such as forming trench contacts 196 to the source structure 170 and the drain structure 180, as shown in FIG. 15.

Figure 16:
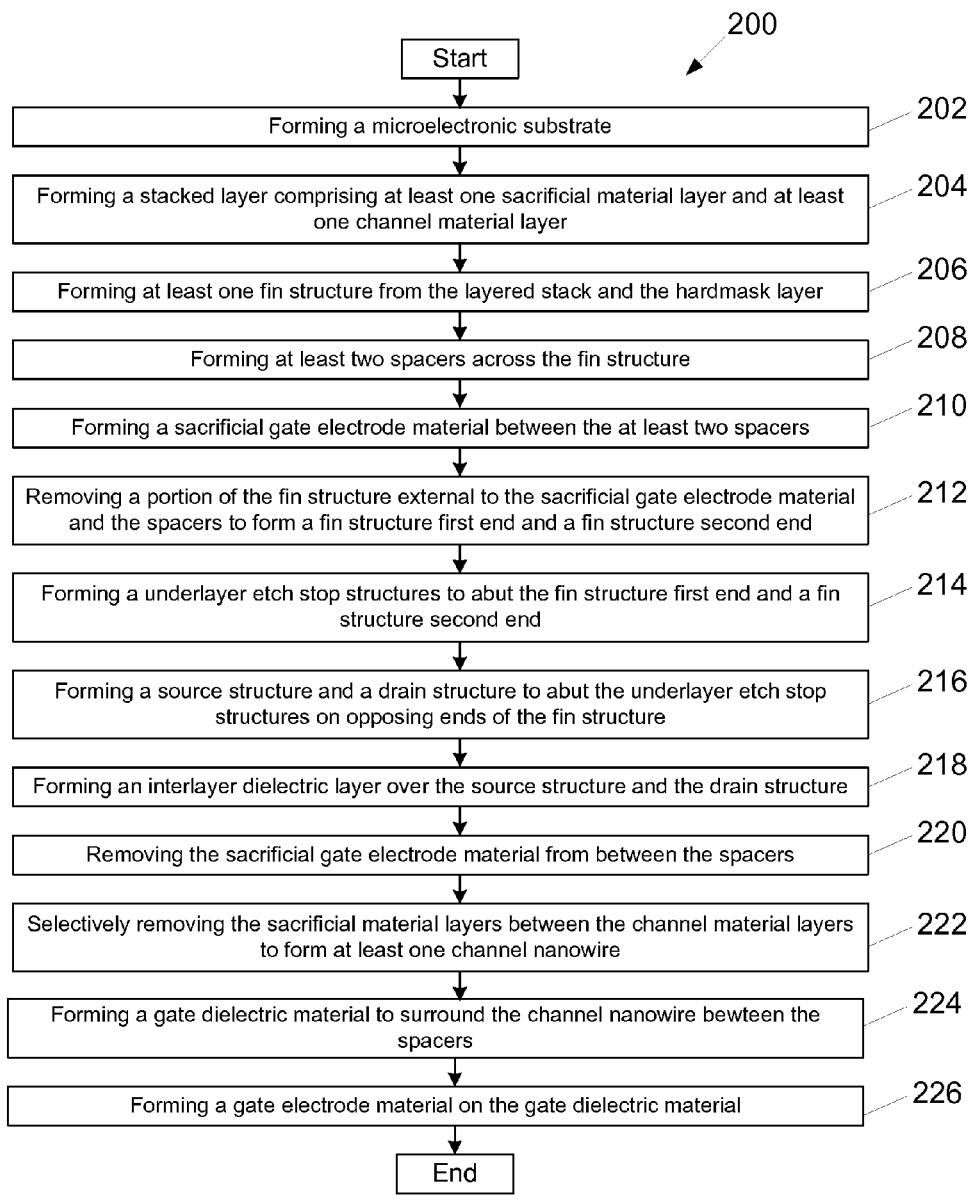
FIG. 16 is a flow chart of a process of fabricating a microelectronic device, according to an embodiment of the present description.

FIG. 16 is a flow chart of a process 200 of fabricating a nanowire transistor structure according to an embodiment of the present description. As set forth in block 202, a microelectronic substrate may be formed. A stacked layer comprising at least one sacrificial material layer and at least one channel material layer may be formed on the microelectronic substrate, as set forth in block 204. At least one fin structure may be formed from the layered stack and the hardmask layer, as set forth in block 206. As set forth in block 208, at least two spacers may be formed across the fin structure. A sacrificial gate electrode material may be formed between the at least two spacers, as set forth in block 210. As set forth in block 212, a portion of the fin structure external to the sacrificial gate electrode material and the spacers may be removed to form a fin structure first end and an opposing fin structure second end. Underlayer etch stop structures may be formed to abut the fin structure first end and the fin structure second end, as set forth in block 214. As set forth in block 216, a source structure and a drain structure may be formed to abut the underlayer etch stop structures on opposing ends of the fin structure. As set forth in block 218, an interlayer dielectric layer may be formed over the source structure and the drain structure. The sacrificial gate electrode material may be removed from between the spacers, as set forth in block 220. As set forth in block 222, the sacrificial material layers may be selectively removed from between the channel material layer to form at least one channel nanowire. As set forth in block 224, a gate dielectric material may be formed to surround the channel nanowire between the spacers. A gate electrode material may be formed on the gate dielectric material, as set forth in block 226.

Figure 17:
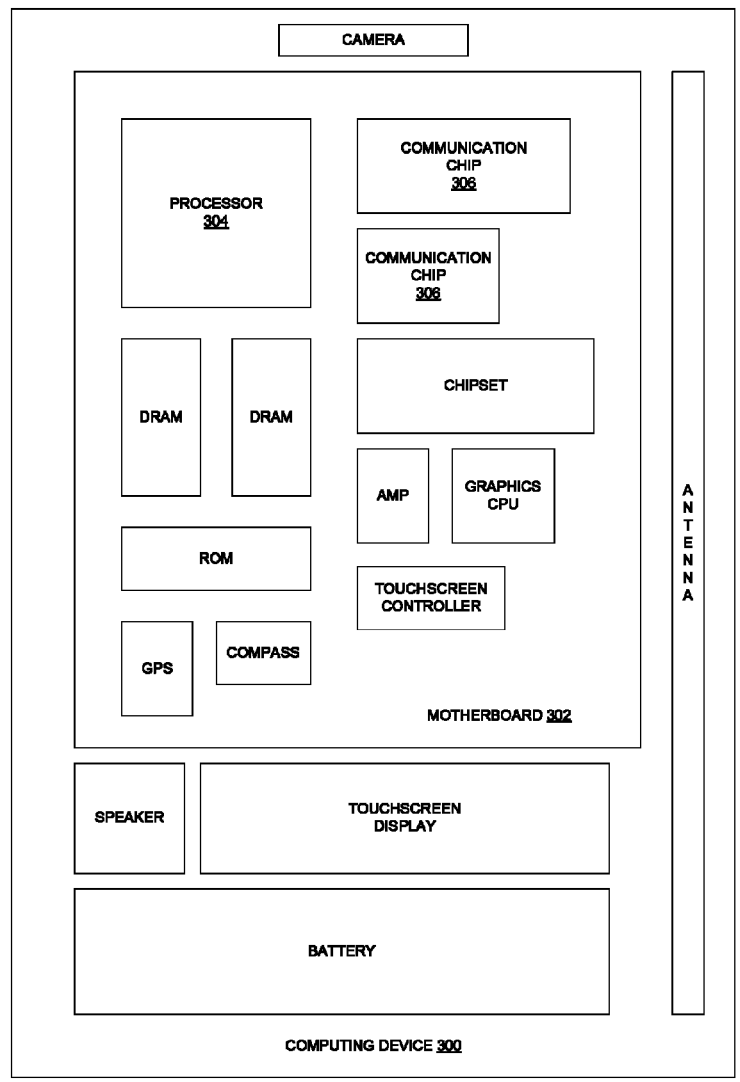
FIG. 17 illustrates a computing device in accordance with one implementation of the present description.

FIG. 17 illustrates a computing device 300 in accordance with one implementation of the present description. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor includes one or more devices, such as nanowire transistors built in accordance with implementations of the present description. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the present description, the integrated circuit die of the communication chip includes one or more devices, such as nanowire transistors built in accordance with implementations of the present description.

In further implementations, another component housed within the computing device 300 may contain an integrated circuit die that includes one or more devices, such as nanowire transistors built in accordance with implementations of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-17. The subject matter may be applied to other microelectronic device and assembly applications, as well as any appropriate transistor application, as will be understood to those skilled in the art.

The following examples pertain to further embodiments, wherein Example 1 is a nanowire transistor, comprising at least one nanowire channel having a first end, and an opposing second end; a source structure proximate the at least one nanowire first end, wherein a first underlayer etch stop structure is disposed between the source structure and the at least one nanowire first end; and a drain structures proximate the at least one nanowire second end, wherein a second underlayer etch stop structure is disposed between the drain structure and the at least one nanowire second end.

In Example 2, the subject matter of Example 1 can optionally include a gate dielectric material abutting the nanowire channel between the nanowire channel first end and the nanowire channel second end.

In Example 3, the subject matter of Example 2 can optionally include a gate electrode material abutting the gate dielectric material.

In Example 4, the subject matter of Example 3 can optionally include the gate electrode material abutting the first underlayer etch stop structure and the second underlayer etch stop structure.

In Example 5, the subject matter of any of Examples 1 to 4 can optionally include the nanowire channel, the first underlayer etch stop structure, and the second underlayer etch stop structure being the same material.

In Example 6, the subject matter of any of Examples 1 to 4 can optionally include the nanowire channel, the first underlayer etch stop structure, and the second underlayer etch stop structure are silicon germanium.

In Example 7, the subject matter of any of Examples 1 to 4 can optionally include the nanowire channel, the first underlayer etch stop structure, and the second underlayer etch stop structure are silicon.

In Example 8, the subject material of any of Examples 1 to 7 wherein the at least one nanowire channel may comprise a plurality of nanowires channels formed above a microelectronic substrate, wherein the nanowire channels are spaced apart from one another.

In Example 9, a method of forming a microelectronic structure may comprises forming a fin structure on a microelectronic substrate, wherein the fin structure comprises at least one sacrificial material layer alternating with at least one channel material layer; forming at least two spacers across the fin structure; forming a sacrificial gate electrode material between the at least two spacers; removing a portion fin structure external to the sacrificial gate electrode material and the spacers to form a fin structure first end and an opposing fin structure second end; forming underlayer etch stop structures to abut the fin structure first end and the fin structure second end; and forming a source structure and a drain structure to abut the underlayer etch stop structures on opposing ends of the fin structure.

In Example 10, the subject matter of Example 9 may optionally include forming an interlayer dielectric layer over the source structure and the drain structure; removing the sacrificial gate electrode material from between the spacers; and selectively removing the sacrificial material layers between the channel material layers to form the at least one channel nanowire.

In Example 11, the subject matter of Example 10 may optionally include forming a gate dielectric material to surround the channel nanowire between the spacers; and forming a gate electrode material on the gate dielectric material.

In Example 12, the subject matter of any one of Examples 9 to 11 may optionally include forming the fin structure on the microelectronic substrate by forming a microelectronic substrate; forming a stacked layer comprising at least one sacrificial material layer alternating with at least one channel material layer; and forming at least one fin structure from the layered stack.

In Example 13, the subject matter of any one of Example 9 to 12 may optionally include the channel material layer, the first underlayer etch stop structure, and the second underlayer etch stop structure being the same material.

In Example 14, the subject matter of any one of Examples 9 to 12 may optionally include the channel material layer, the first underlayer etch stop structure, and the second underlayer etch stop structure being silicon germanium.

In Example 15, the subject matter of any one of Examples 9 to 12 may optionally include the channel material layer, the first underlayer etch stop structure, and the second underlayer etch stop structure being silicon.

In Example 16, a computing device may comprise a board including at least one component, wherein the at least one component includes at least one microelectronic structure comprising a nanowire transistor including at least one nanowire channel having a first end, and an opposing second end; a source structure proximate the at least one nanowire first end, wherein a first underlayer etch stop structure is disposed between the source structure and the at least one nanowire first end; and a drain structures proximate the at least one nanowire second end, wherein a second underlayer etch stop structure is disposed between the drain structure and the at least one nanowire second end.

In Example 17, the subject matter of Example 16 can optionally include a gate dielectric material abutting the nanowire channel between the nanowire channel first end and the nanowire channel second end.

In Example 18, the subject matter of Example 17 can optionally include a gate electrode material abutting the gate dielectric material.

In Example 19, the subject matter of Example 18 can optionally include the gate electrode material abutting the first underlayer etch stop structure and the second underlayer etch stop structure.

In Example 20, the subject matter of any of Examples 16 to 19 can optionally include the nanowire channel, the first underlayer etch stop structure, and the second underlayer etch stop structure being the same material.

In Example 21, the subject matter of any of Examples 16 to 19 can optionally include the nanowire channel, the first underlayer etch stop structure, and the second underlayer etch stop structure being silicon germanium.

In Example 22, the subject matter of any of Examples 16 to 19 can optionally include the nanowire channel, the first underlayer etch stop structure, and the second underlayer etch stop structure being silicon.

In Example 23, the subject material of any of Examples 16 to 22 wherein the at least one nanowire channel may comprise a plurality of nanowires channels formed above a microelectronic substrate, wherein the nanowire channels are spaced apart from one another.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of forming a microelectronic structure, comprising:
   forming a fin structure on a microelectronic substrate, wherein the fin structure comprises at least one sacrificial material layer alternating with at least one channel material layer;
   forming at least two spacers across the fin structure;
   forming a sacrificial gate electrode material between the at least two spacers;
   removing a portion fin structure external to the sacrificial gate electrode material and the spacers to form a fin structure first end and an opposing fin structure second end;
   forming underlayer etch stop structures to abut the fin structure first end and the fin structure second end; and
   forming a source structure and a drain structure to abut the underlayer etch stop structures on opposing ends of the fin structure.

2. The method of claim 1, further including:
   forming an interlayer dielectric layer over the source structure and the drain structure;
   removing the sacrificial gate electrode material from between the spacers;
   and selectively removing the sacrificial material layers between the channel material layers to form the at least one channel nanowire.

3. The method of claim 2, further including:
   forming a gate dielectric material to surround the channel nanowire between the spacers; and
   forming a gate electrode material on the gate dielectric material.

4. The method of claim 1, wherein forming the fin structure on the microelectronic substrate, wherein the fin structure comprises at least one sacrificial material layer alternating with at least one channel material layer, comprises:
   forming a microelectronic substrate;
   forming a stacked layer comprising at least one sacrificial material layer alternating with at least one channel material layer; and
   forming at least one fin structure from the layered stack.

5. The method of claim 1, wherein the channel material layer, the first underlayer etch stop structure, and the second underlayer etch stop structure are the same material.

6. The method of claim 1, wherein the channel material layer, the first underlayer etch stop structure, and the second underlayer etch stop structure are silicon germanium.

7. The method of claim 1, wherein the channel material layer, the first underlayer etch stop structure, and the second underlayer etch stop structure are silicon.

* * * * *